United States Patent
Yeh et al.

(10) Patent No.: US 8,263,433 B2
(45) Date of Patent: Sep. 11, 2012

(54) METHOD OF FABRICATING AN ACTIVE DEVICE ARRAY AND FABRICATING AN ORGANIC LIGHT EMITTING DIODE ARRAY

(75) Inventors: Yung-Hui Yeh, Hsinchu (TW); Chih-Ming Lai, Changhua County (TW); Chun-Cheng Cheng, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 25 days.

(21) Appl. No.: 13/050,951

(22) Filed: Mar. 18, 2011

(65) Prior Publication Data

US 2012/0164766 A1 Jun. 28, 2012

(30) Foreign Application Priority Data

Dec. 28, 2010 (TW) .............................. 99146379 A

(51) Int. Cl.
*H01L 21/00* (2006.01)
(52) U.S. Cl. ..... 438/104; 257/43; 257/66; 257/E21.411; 438/34; 438/45; 438/149
(58) Field of Classification Search .................... 257/43, 257/66, E21.411; 438/34, 45, 104, 149
See application file for complete search history.

(56) References Cited

U.S. PATENT DOCUMENTS

| | | | |
|---|---|---|---|
| 6,504,215 B1 * | 1/2003 | Yamanaka et al. ............ | 257/350 |
| 7,202,179 B2 | 4/2007 | Taussig et al. | |
| 7,248,306 B2 | 7/2007 | Perner et al. | |
| 7,341,893 B2 | 3/2008 | Mei et al. | |
| 7,521,313 B2 | 4/2009 | Mei | |
| 7,541,227 B2 | 6/2009 | Mei et al. | |
| 7,585,424 B2 | 9/2009 | Mei | |
| 2006/0017875 A1 | 1/2006 | Perner et al. | |
| 2006/0134922 A1 | 6/2006 | Taussig et al. | |
| 2007/0040491 A1 | 2/2007 | Mei et al. | |

(Continued)

FOREIGN PATENT DOCUMENTS

TW 201011719 3/2010

(Continued)

OTHER PUBLICATIONS

Carl Taussig et al, "77.3: Invited Paper: Roll-to-Roll Manufacturing of Backplanes for Paper-Like Displays", SID Symposium Digest of Technical Papers, vol. 41, Issue 1, issued on May 2010—p. 1151-p. 1154.

Yung-Hui Yeh et al, "P-37: Room Temperature Top-Gate Self-Aligned Amorphous InGaZnO TFTs Fabricated on Colorless Polyimide Substrate", SID Symposium Digest of Technical Papers, vol. 41, Issue 1, issued on May 2010, p. 1353-p. 1355.

(Continued)

*Primary Examiner* — Asok Sarkar
(74) *Attorney, Agent, or Firm* — Jianq Chyun IP Office

(57) ABSTRACT

Methods of fabricating active device array and organic light emitting diode array are provided. A first pattern metal layer is formed over a substrate. An oxide semiconductor layer is formed entirely over the substrate. A first insulation layer covering the first patterned metal layer and the oxide semiconductor layer is formed entirely on the substrate. A second patterned metal layer is formed on the first insulation layer. The oxide semiconductor layer and the first insulation layer is patterned by using the second patterned metal layer as a mask to form a first patterned oxide semiconductor layer and a first patterned insulation layer. A second insulation layer is entirely formed on the substrate. A second patterned oxide semiconductor layer is formed over the second insulation layer. A third patterned metal layer is formed over the second insulation layer.

24 Claims, 20 Drawing Sheets

U.S. PATENT DOCUMENTS

| | | | |
|---|---|---|---|
| 2007/0117278 | A1 | 5/2007 | Perlov et al. |
| 2008/0185591 | A1 | 8/2008 | Mei et al. |
| 2008/0207077 | A1 | 8/2008 | Haase |
| 2008/0248605 | A1 | 10/2008 | Taussig et al. |
| 2008/0303037 | A1 | 12/2008 | Irving et al. |
| 2009/0261325 | A1 * | 10/2009 | Kawamura et al. ............. 257/43 |
| 2010/0019656 | A1 | 1/2010 | Yu et al. |

FOREIGN PATENT DOCUMENTS

| | | |
|---|---|---|
| TW | 201029184 | 8/2010 |

OTHER PUBLICATIONS

Warren Jackson et al, "58.3: Fabrication of Zinc Tin Oxide TFTs by Self-Aligned Imprint Lithography (SAIL) on Flexible Substrates", SID Symposium Digest of Technical Papers, vol. 40, Issue 1, issued on Jun. 20099, p. 873-p. 876.

Ohseung Kwon et al, "Manufactured Flexible Active Matrix Backplanes using Self-Alighed Imprint Lithography (SAIL)", appears in IMID 2009 Digest, issued on 2009, p. 138-p. 141.

* cited by examiner

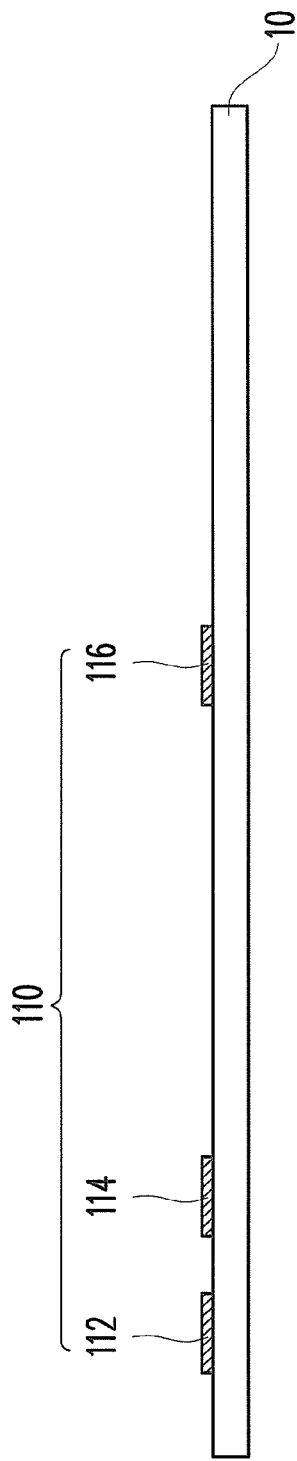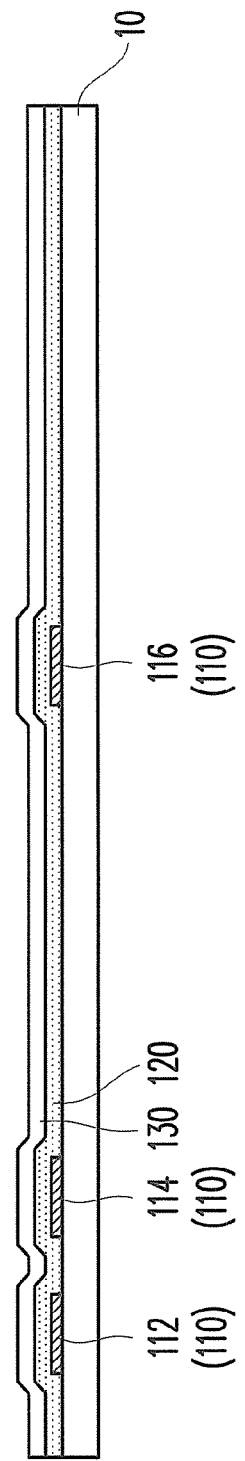

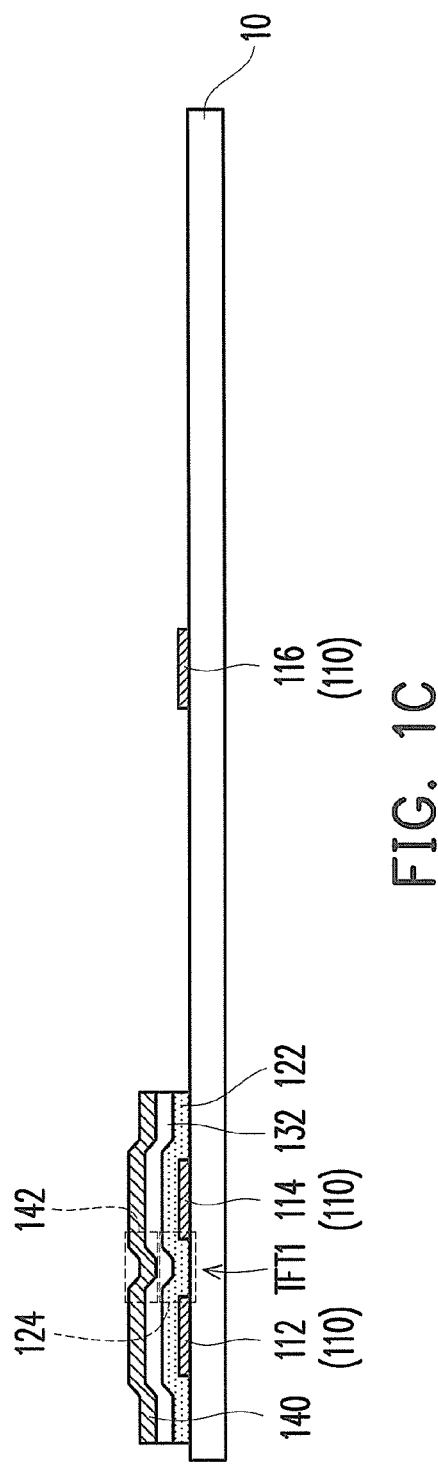
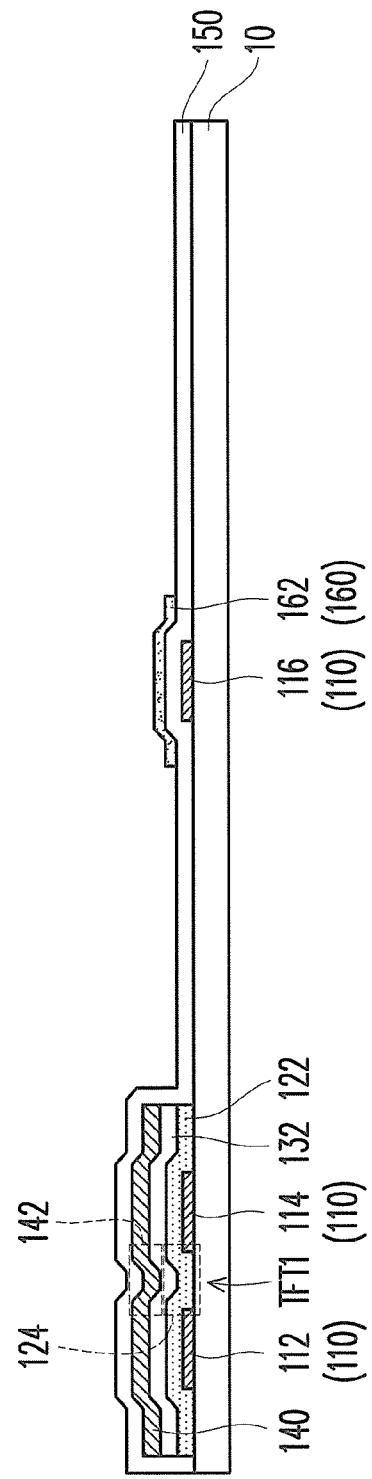

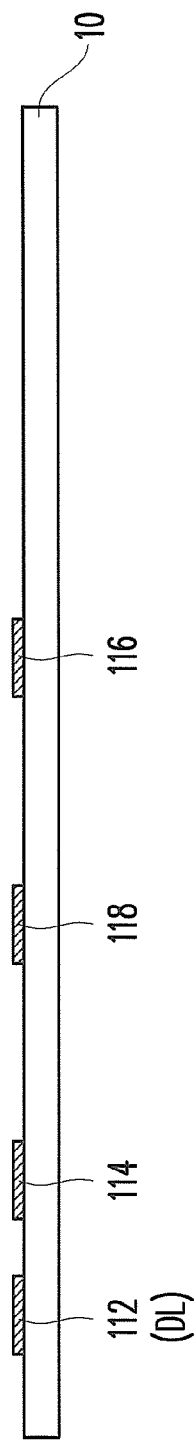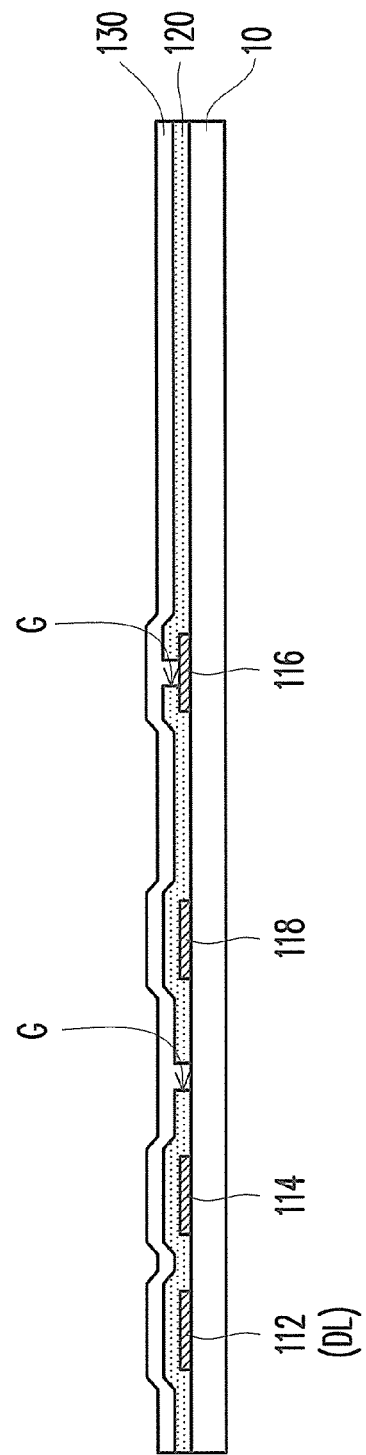

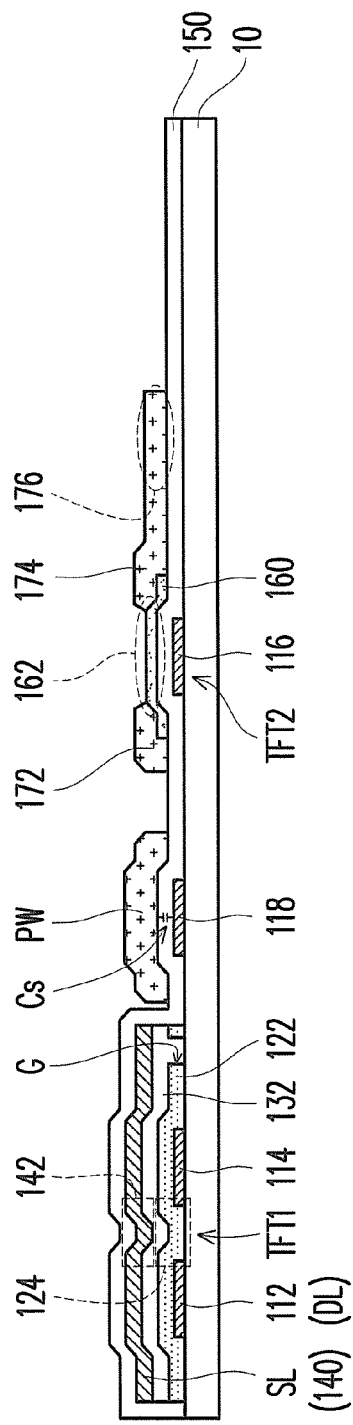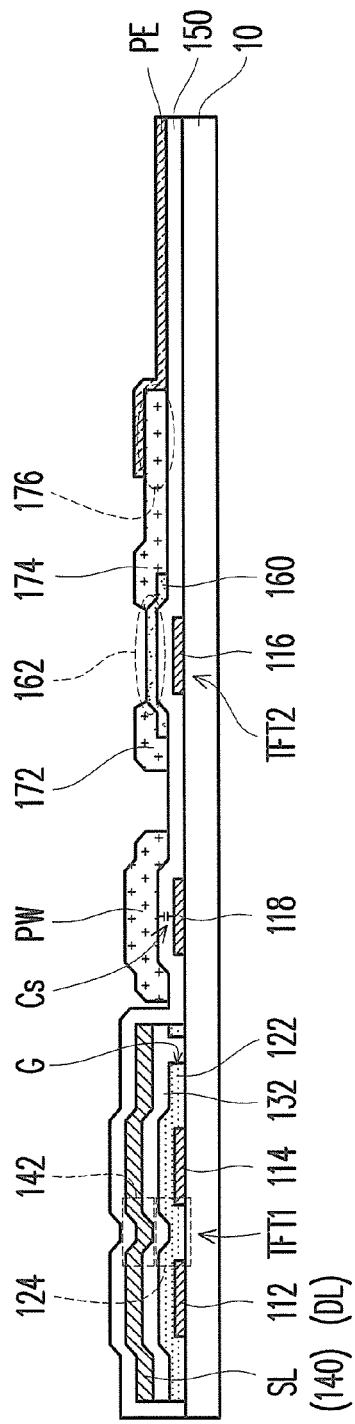

METHOD OF FABRICATING AN ACTIVE DEVICE ARRAY AND FABRICATING AN ORGANIC LIGHT EMITTING DIODE ARRAY

CROSS-REFERENCE TO RELATED APPLICATION

This application claims the priority benefit of Taiwan application serial no. 99146379, filed on Dec. 28, 2010. The entirety of the above-mentioned patent application is hereby incorporated by reference herein and made a part of this specification.

BACKGROUND OF THE APPLICATION

1. Field of the Application

The disclosure is related to methods of fabricating an active device array and an organic light emitting diode array.

2. Description of Related Art

With rapid development of image display technologies, cathode ray tube (CRT) displays that used to be applied in televisions or computers have been gradually replaced by flat panel displays (FPDs). Comparing with a rigid carrier substrate such as glass substrate, a flexible substrate such as plastic substrate has the characteristics of good flexibility and desirable impact endurance. Therefore, a flexible display having the active devices, such as the thin film transistors, disposed on the flexible substrate are recently provided.

It is worthy to note that the flexible substrate has greater coefficient of thermal expansion than the glass substrate. During the fabrication of the flexible display, the flexible substrate can expand or shrink due to the temperature change in the environment. Therefore, the problems of poor alignment accuracy and stringent temperature restriction are requested to be overcome when fabricating the thin film transistor on the flexible substrate.

Technologies of forming thin film transistor on the flexible substrate by using a roll-to-roll process have been provided in U.S. Pat. Nos. 7,202,179, 7,248,306, 7,341,839, 7,541,227, 7,521,313, 7,585,424, US Patent Publication No. 2006/0134922, US Patent Publication No. 2007/0040491, US Patent Publication No. 2007/0117278, US Patent Publication No. 2008/0185591, US Patent Publication No. 2008/0248605, U.S. Pat. No. 7,248,306, US Patent Publication No. 2006/0017875, and US Patent Publication No. 2008/0248605. Generally, the roll-to-roll process has the advantages of low cost for fabrication factor and facilitating the fabrication of the device with large area, which is suitable for being applied in the process for fabricating the thin film transistors.

SUMMARY OF THE APPLICATION

The disclosure provides a method of fabricating an active device array having favorable alignment accuracy.

The disclosure provides a method of fabricating an organic light emitting diode array on a flexible substrate, wherein the method has favorable alignment accuracy.

An aspect of the disclosure directs to a method of fabricating an active device array, wherein the active device array includes at least one first transistor and at least one second transistor. A first patterned metal layer is formed over a substrate, and the first patterned metal layer includes a first source of the first transistor, a first drain of the first transistor, and a second gate of the second transistor, wherein the first drain and the first source are separated from each other. An oxide semiconductor layer is formed over the substrate entirely. A first insulation layer is formed on the substrate entirely to cover the oxide semiconductor layer and the first patterned metal layer. A second patterned metal layer is formed on the first insulation layer, wherein the second patterned metal layer defines a first gate of the first transistor located between the first source and the first drain. The oxide semiconductor layer and the first insulation layer are patterned by using the second patterned metal layer as a mask to form a first patterned oxide semiconductor layer and a first patterned insulation layer, wherein the first patterned oxide semiconductor layer includes a first channel layer of the first transistor. A second insulation layer is formed on the substrate entirely to cover the first transistor and the second gate. A second patterned oxide semiconductor layer is formed over the second insulation layer, and the second patterned oxide semiconductor layer includes a second channel layer located above the second gate. A third patterned metal layer is formed over the second insulation layer. The third patterned metal layer includes a second source of the second transistor and a second drain of the second transistor, wherein the second source and the second drain are respectively located at two opposite sides of the second gate.

Another aspect of the disclosure directs to a method of fabricating an organic light emitting diode array. The organic light emitting diode array includes a plurality of scan lines, a plurality of data lines, a plurality of power lines, and a plurality of pixels, and each of the pixels includes a first transistor, a second transistor, and a pixel electrode. The first transistor is electrically connected to one of the scan lines and one of the data lines. The second transistor is connected to the first transistor, one of the power lines, and the pixel electrode. A first patterned metal layer is formed over a substrate. The first patterned metal layer includes the data lines, a plurality of first sources of the first transistors, a plurality of first drains of the first transistors, and a plurality of second gates of the second transistors, wherein the first drains are connected to the second gates and separated from the data lines. An oxide semiconductor layer is formed over the substrate entirely. A first insulation layer is formed on the substrate entirely to cover the oxide semiconductor layer and the first patterned metal layer. A second patterned metal layer is formed on the first insulation layer, wherein the second patterned metal layer includes the scan lines intersecting the data lines and the first drains so as to define a plurality of first gates of the first transistor. The oxide semiconductor layer and the first insulation layer are patterned by using the second patterned metal layer as a mask to form a first patterned oxide semiconductor layer and a first patterned insulation layer, wherein the first patterned oxide semiconductor layer includes a plurality of first channel layers of the first transistors. A second insulation layer is formed on the substrate entirely to cover the first transistors, the scan lines, and the second gates. A second patterned oxide semiconductor layer is formed over the second insulation layer, and the second patterned oxide semiconductor layer includes a plurality of second channel layers located above the second gates, respectively. A third patterned metal layer is formed over the second insulation layer. The third patterned metal layer includes the power lines, a plurality of second sources of the second transistors, and a plurality of second drains of the second transistors, wherein the second sources are connected to the power lines and the second sources and the second drains are respectively located at two opposite sides of the second gates. The pixel electrodes are formed on the substrate, wherein each of the pixel electrodes is electrically connected to one of the second drains. A third insulation layer is formed on the substrate to cover the first transistors and the second transistors.

In light of the foregoing description, the channel layer of the organic light emitting diode pixel is fabricated by the oxide semiconductor material according to the disclosure. It is noted that the oxide semiconductor material has the characteristic such as an ohmic contact without being subjected to additional ion implanting process, ion activating process, ion diffusing process, or similar high temperature process. The high temperature process can be omitted in the method of fabricating the organic light emitting diode array according to the disclosure. Therefore, the method of fabricating the organic light emitting diode array according to the disclosure can be performed on the substrate with low heat resistance, e.g. the plastic substrate. Furthermore, the scan line is served as a mask for patterning one of the channel layers based on the disclosure, which facilitates the self-alignment between the scan line and the channel layer. The method of fabricating the organic light emitting diode array achieves favorable alignment accuracy.

In order to make the aforementioned and other features and advantages of the application more comprehensible, embodiments accompanying figures are described in detail below.

BRIEF DESCRIPTION OF THE DRAWINGS

The accompanying drawings are included to provide a further understanding of the application, and are incorporated in and constitute a part of this specification. The drawings illustrate embodiments of the application and, together with the description, serve to explain the principles of the application.

FIG. 1A through FIG. 1E are the cross-sectional views schematically illustrating a method of fabricating an active device array according to en embodiment of the disclosure.

FIG. 6A through FIG. 6G are schematic cross-sectional views along a line A-A' of FIGS. 5A to 5G.

DESCRIPTION OF EMBODIMENTS

Figure 1E:
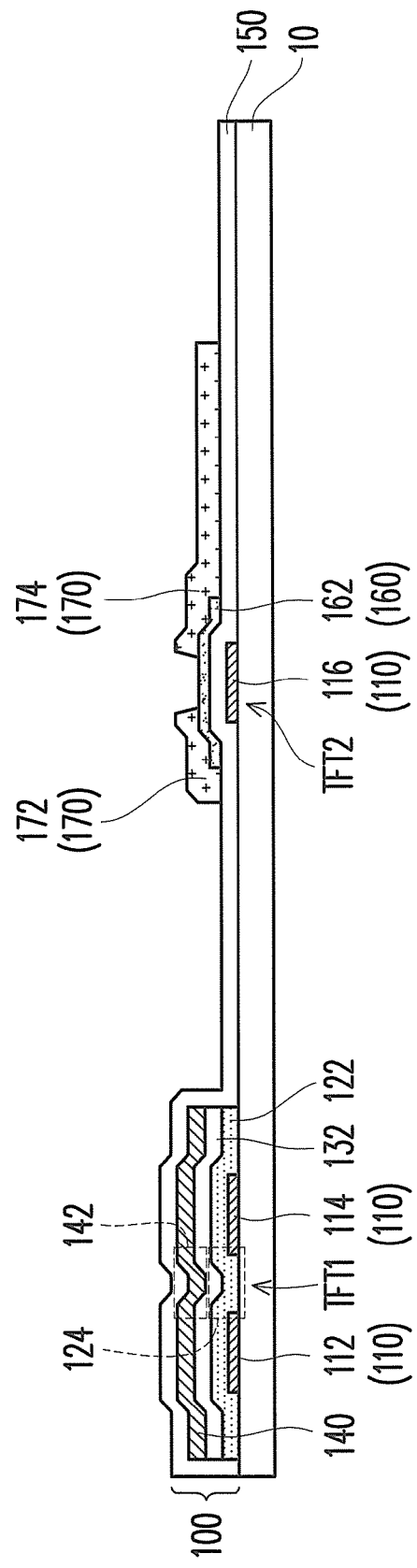

FIG. 1A through FIG. 1E are the cross-sectional views schematically illustrating a method of fabricating an active device array according to en embodiment of the disclosure. Referring to FIG. 1A, a method according to the present embodiment includes forming a first patterned metal layer 110 on a substrate 10 first, wherein the first patterned metal layer 110 includes a first source 112, a first drain 114, and a second gate 116. In the present embodiment, the material of the substrate 10 can be the flexible materials such as plastic, metal, or stainless steel so as to fabricate a flexible product. The material of the first patterned metal layer 110 can be selected from titanium (Ti), aluminum (Al), molybdenum (Mo), chromium (Cr), molybdenum-tungsten (Mo—W) alloy, indium tin oxide (ITO), or a combination thereof. In one embodiment, the first patterned metal layer 110 can be formed by a single material layer as well as a stack of multiple material layers. For example, the first patterned metal layer 110 can be formed by a stack of Ti/Al layers, a stack of Ti/Mo layers, a stack of Ti/Al/Ti layers, a stack of Ti/Al/Mo layers, a stack of Mo/Al/Mo layers, or a stack of Al/ITO layers. In specific, the process of forming the first patterned metal layer 110 can be a roll-to-roll sputtering process. A thickness of the first patterned metal layer 110 is usually ranged from 100 nm to 400 nm.

Thereafter, referring to FIG. 1B, an oxide semiconductor layer 120 and a first insulation layer 130 are formed over the substrate 10 entirely. The first insulation layer 130 covers the first patterned metal layer 110 and the oxide semiconductor layer 120. A material of the oxide semiconductor layer 120 includes zinc oxide (ZnO), indium gallium zinc oxide (IGZO), indium zinc tin oxide (IZTO), and the like. The oxide semiconductor layer 120 can be doped with a dopant selected from indium (In), aluminum (Al), gallium (Ga), tin (Sn), or a combination of the above. Therefore, the oxide semiconductor layer 120 can be a metal oxide semiconductor thin film doped with In, Al, Ga, Sn, or a combination thereof. A thickness of the oxide semiconductor layer 120 is usually ranged from 10 nm to 150 nm. A material of the first insulation layer 130 may include $Si_3N_4$, $SiO_2$, $Al_2O_3$, $Ta_2O_5$, $HfO_2$, or $TiO_2$. The substrate 10 in the present embodiment is a flexible substrate and thus a roll-to-roll sputtering process can be adopted to fabricate the oxide semiconductor layer 120 and the first insulation layer 130. A thickness of the first insulation layer 130 is usually ranged from 100 nm to 500 nm.

Next, referring to FIG. 1C, a second patterned metal layer 140 is formed on the substrate 10 and the first insulation layer 130 and the oxide semiconductor layer 120 are patterned by using the second patterned metal layer 140 as a mask such that a first patterned insulation layer 132 and a first patterned oxide semiconductor layer 122 are fabricated. The process for forming the second patterned metal layer 140 can be performing a roll-to-roll sputtering process for forming a metal material layer (not shown) on the substrate and subsequently patterning the metal material layer (not shown) to fabricate the second patterned metal layer 140. A thickness of the second patterned metal layer 140 is usually ranged from 100 nm to 400 nm. In this embodiment, the second patterned metal layer 140 includes the first gate 142 located between the first source 112 and the first drain 114 and the first patterned oxide semiconductor layer 122 includes a first channel layer 124 corresponding to the first gate. Herein, the first gate 142, the first channel layer 124, the first source 112, and the first drain 114 together constitute a first transistor TFT1.

The material of the second patterned metal layer 140 can be selected from titanium, aluminum, molybdenum, chromium, molybdenum-tungsten alloy, indium tin oxide (ITO), or a combination thereof. In addition, the second patterned metal layer 140 can be formed by a single material layer or a stack of multiple material layers. In the present embodiment, the first channel layer 124 is patterned by using the first gate 142 as a mask so that the first channel layer 124 and the first gate 142 are self-aligned fabricated, which reduces the occurrence of mis-alignment and conduces to improve the fabricating yield rate of the fabricating method.

Furthermore, the first channel layer 124 is formed by oxide semiconductor material which has the characteristic such as an ohmic contact. Accordingly, the formation of the ohmic contact connecting the first channel layer 124 to the first source 112 and the first drain 114 by using an ion implanting process or other high temperature process is not required. When the material of the substrate 10 is the materials with low heat resistance such as plastics, the substrate 10 is prevented from deformed due to the high fabrication temperature of the ion implanting process or other high temperature process. In a word, the substrate 10 can be protected from damaged or deformed by using the oxide semiconductor material to fabricate the first channel layer 124.

Thereafter, referring to FIG. 1D, a second insulation layer 150 and a second patterned oxide semiconductor layer 160 are formed on the substrate 10, wherein the second insulation layer 150 covers the first transistor TFT1 and the second gate 116. The second patterned oxide semiconductor layer 160 includes the second channel layer 162 located above the second gate 116. A material of the second insulation layer 150 can be selected from the materials used for forming the first insulation layer 132 and the second patterned oxide semiconductor layer 160 can be formed by the same material as the first patterned oxide semiconductor layer 122. Namely, the second channel layer 162 can be fabricated by doped metal oxide semiconductor material. It is noted that the second insulation layer 150 and the second patterned oxide semiconductor layer 160 can be fabricated by the roll-to-roll sputtering process. A thickness of the second patterned oxide semiconductor layer 160 is usually ranged from 10 nm to 150 nm and a thickness of the second insulation layer 150 is usually ranged from 100 nm to 500 nm.

Referring to FIG. 1E, a third patterned metal layer 170 is then formed over the substrate 10 and the third patterned metal layer 170 at least includes a second source 172 and a second drain 174. The second source 172 and the second drain 174 are located at two opposite sides of the second gate 116. The material and the layer structure capable of being applied in forming the third patterned metal layer 170 can be referred to those of the first patterned metal layer 110. Accordingly, the third patterned metal layer 170 can be formed by a single material layer as well as a stack of multiple material layers. A thickness of the third patterned metal layer 170 is usually ranged from 100 nm to 400 nm. Herein, the second gate 116, the second channel layer 162, the second source 172, and the second drain 174 together constitute a second transistor TFT2. The first transistor TFT1 and the second transistor TFT2 form an active device array 100, wherein the first transistor TFT1 can be a top gate type thin film transistor and the second transistor TFT2 can be a bottom gate type thin film transistor.

One first transistor TFT1 and one second transistor TFT2 are illustrated in the active device array 100, but it is not intend to limit the application. In an alternative embodiment, the active device array 100 can include a plurality of first transistor TFT1 and a plurality of second transistor TFT2. If the number of the first transistor TFT1 is plural, the process illustrated in FIG. 1B can further includes forming a plurality of gaps (not shown) in the oxide semiconductor layer 120 so that the first channels 124 of different first transistors TFT1 can be separated and the first transistors TFT1 each has independent electric characteristic. Nevertheless, the application should not be construed as limited to the embodiments set forth herein.

Figure 2:
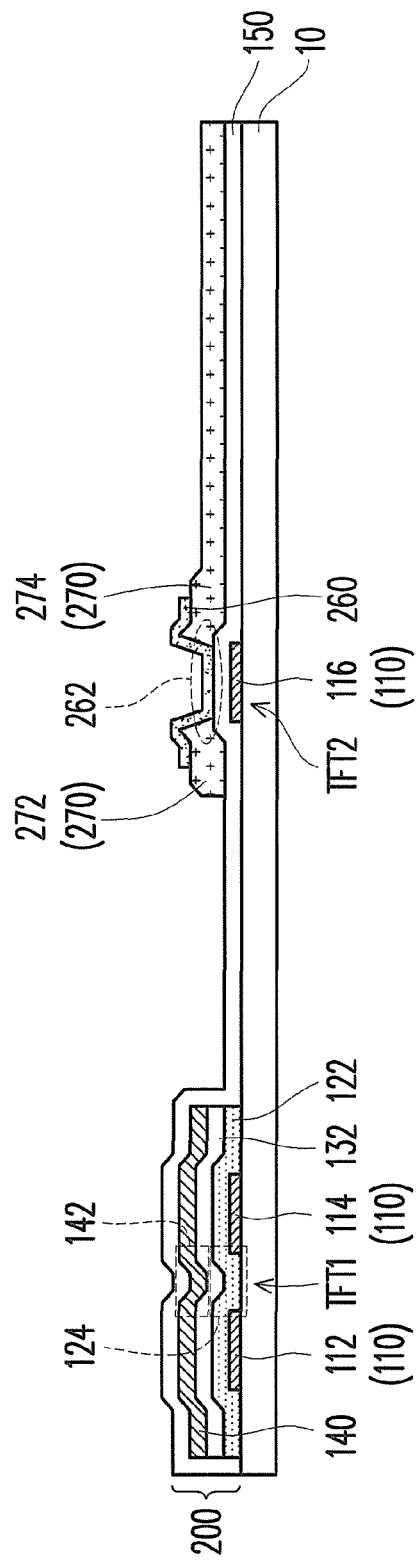
FIG. 2 is a schematic cross-sectional view illustrating an active device array according to another embodiment of the disclosure.

FIG. 2 is a schematic cross-sectional view illustrating an active device array according to another embodiment of the disclosure. Referring to FIG. 2, an active device array 200 is, for example, disposed on the substrate 10 and the active device array 200, similar to the active device array 100, includes a first transistor TFT1 and a second transistor TFT2. Thus, in the explanation of the following embodiment, components identical to those of FIG. 1 will be denoted with the same numerals and not repeated. The difference between the present embodiment and the aforesaid embodiment lies in that the third patterned metal layer 270 is formed on the substrate 10 prior to the second patterned oxide semiconductor layer 260 is formed when fabricating the second transistor TFT2 according to the present embodiment. A portion of the second channel layer 262 is located between the second source 272 and the second drain 274, another portion of the second channel layer 262 covers the second source 272, and further another portion of the second channel layer 262 covers the second drain 274.

Figure 3:
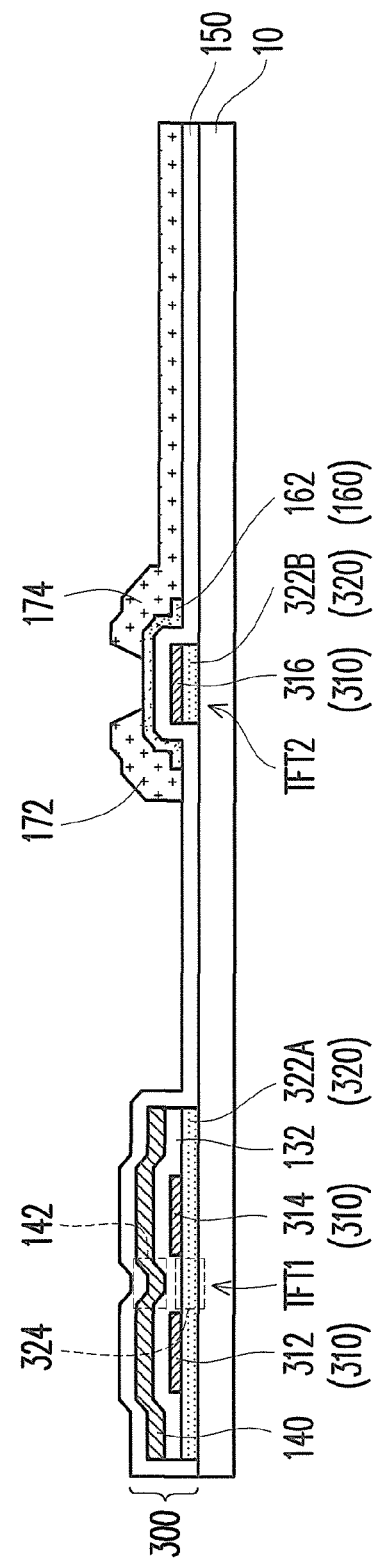
FIG. 3 is a schematic cross-sectional view illustrating an active device array according to further another embodiment of the disclosure.

FIG. 3 is a schematic cross-sectional view illustrating an active device array according to further another embodiment of the disclosure. Referring to FIG. 3, an active device array 300 is, for example, disposed on the substrate 10 and the active device array 300, similar to the active device array 100, includes a first transistor TFT1 and a second transistor TFT2. Thus, in the explanation of the following embodiment, components identical to those of FIG. 1 will be denoted with the same numerals and not repeated. The difference between the present embodiment and the aforesaid embodiment lies in that the oxide semiconductor layer (not shown) is formed prior to the first patterned metal layer 310 is formed when fabricating the first transistor TFT1 according to the present embodiment.

According to the process that the oxide semiconductor layer (not shown) is formed prior to the first patterned metal layer 310 is formed, the first patterned oxide semiconductor layer 322 can be shielded by the first patterned metal layer 310. Accordingly, the first patterned oxide semiconductor layer 322 formed by using the second patterned metal layer 140 as a mask has a portion 322A located under the second patterned metal layer 140 and a portion 322B located under the second gate 316. The portion 322A under the second patterned metal layer 140 includes the first channel layer 324 exposed by the first source 312 and the first drain 314.

As a whole, the active device arrays 100~300 disclosed in the aforesaid embodiments can be used for achieving the required circuit design through a plurality of transistors, which can be served as a driving circuit or a switching element in each pixel of a display panel. The following embodiment exemplarily applies the active device arrays 100~300 in an organic light emitting diode array, but the application should not be limited thereto.

Figure 4:
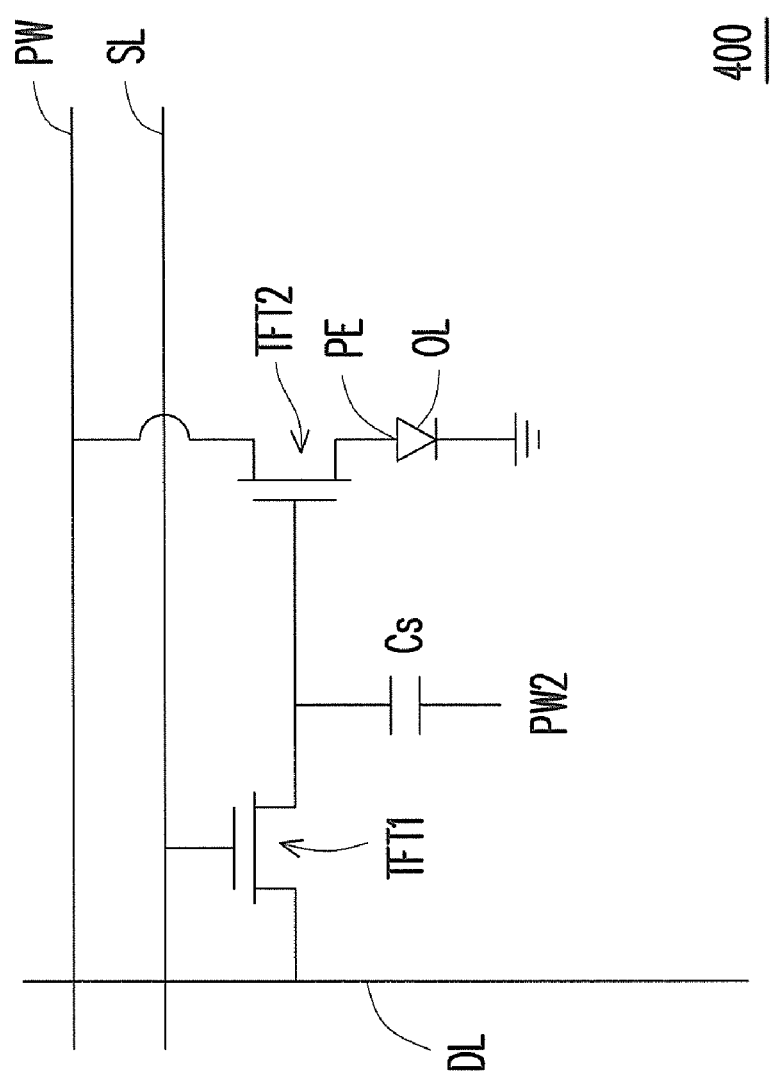
FIG. 4 is a schematic circuit configuration of an organic light emitting diode pixel according to an embodiment of the disclosure.

FIG. 4 is a schematic circuit configuration of an organic light emitting diode pixel according to an embodiment of the disclosure. Referring to FIG. 4, an organic light emitting diode pixel 400 is connected to power lines PW-PW2, a scan line SL, and a data line DL and includes a first transistor TFT1, a second transistor TFT2, an organic light emitting unit OL, and a storage capacitor Cs. The first transistor TFT1 is connected to the scan line SL and the data line DL and the second transistor TFT2 is connected to the first transistor TFT1 and the power line PW. A terminal of the storage capacitor Cs is configured between the first transistor TFT1 and the second transistor TFT2 and the other terminal of the storage capacitor Cs is connected to another power line PW2. In the pixel design, the power line PW2 can be independent from the power line PW and the power lines PW and PW2 can be input by different voltages. Nevertheless, the power line PW and the power line PW2 can be connected to the same power source to receive the same voltage, which is conducive to increase the display aperture ratio of the organic light emitting diode pixel 400. The organic light emitting unit OL is connected to the second transistor TFT2. A pixel electrode PE of the organic light emitting unit OL is connected to the second transistor TFT2 specifically. In the present embodiment, the first transistor TFT1 is a switching transistor used for controlling the on/off state of the second transistor TFT2 according to the signals transmitted by the scan line SL and the data line DL. The second transistor TFT2 is a driving transistor used for driving the organic light emitting unit OL.

Figure 5A:
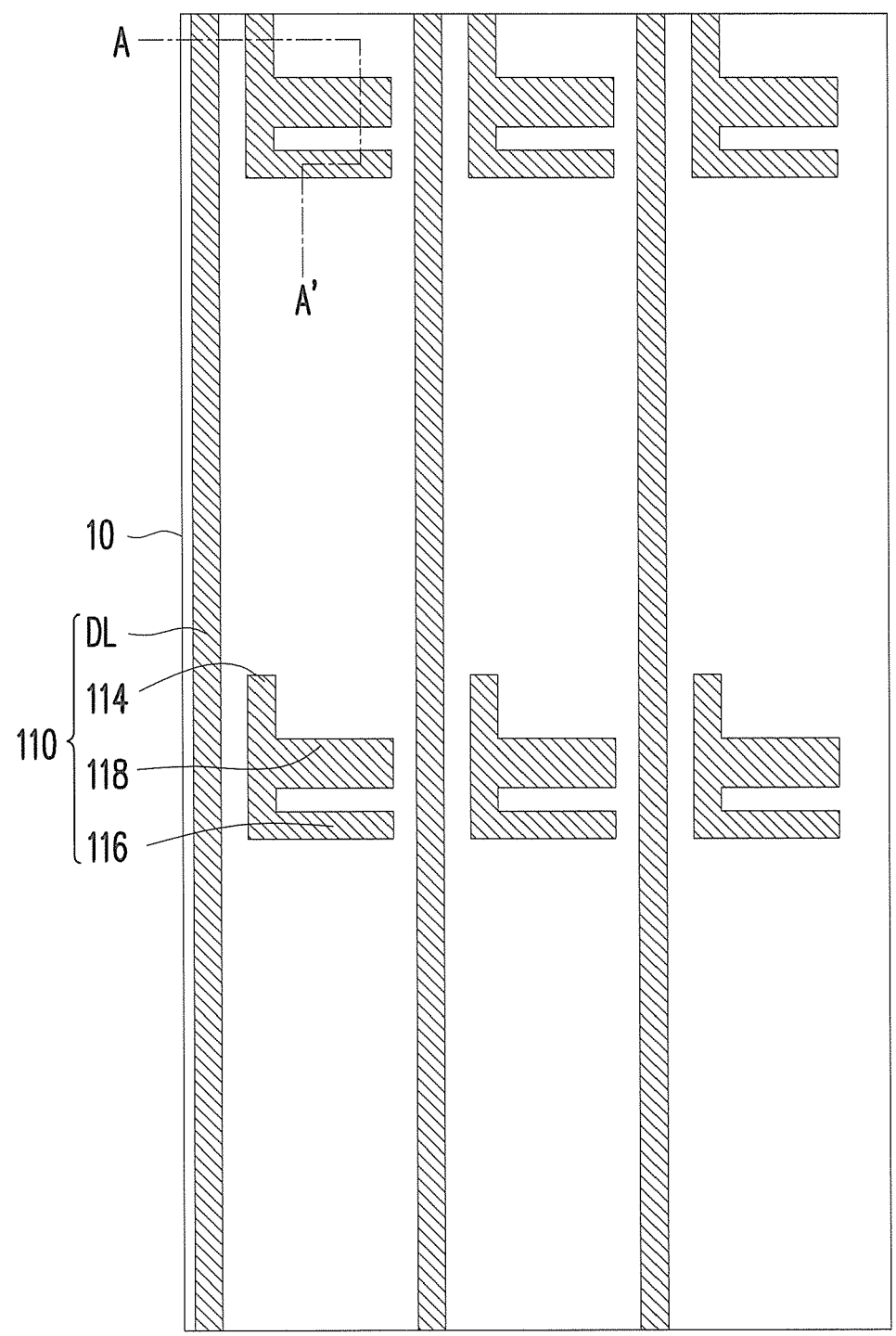
FIG. 5A through FIG. 5G are the top views schematically illustrating a method of fabricating an organic light emitting diode array according to en embodiment of the disclosure.
Figure 5B:
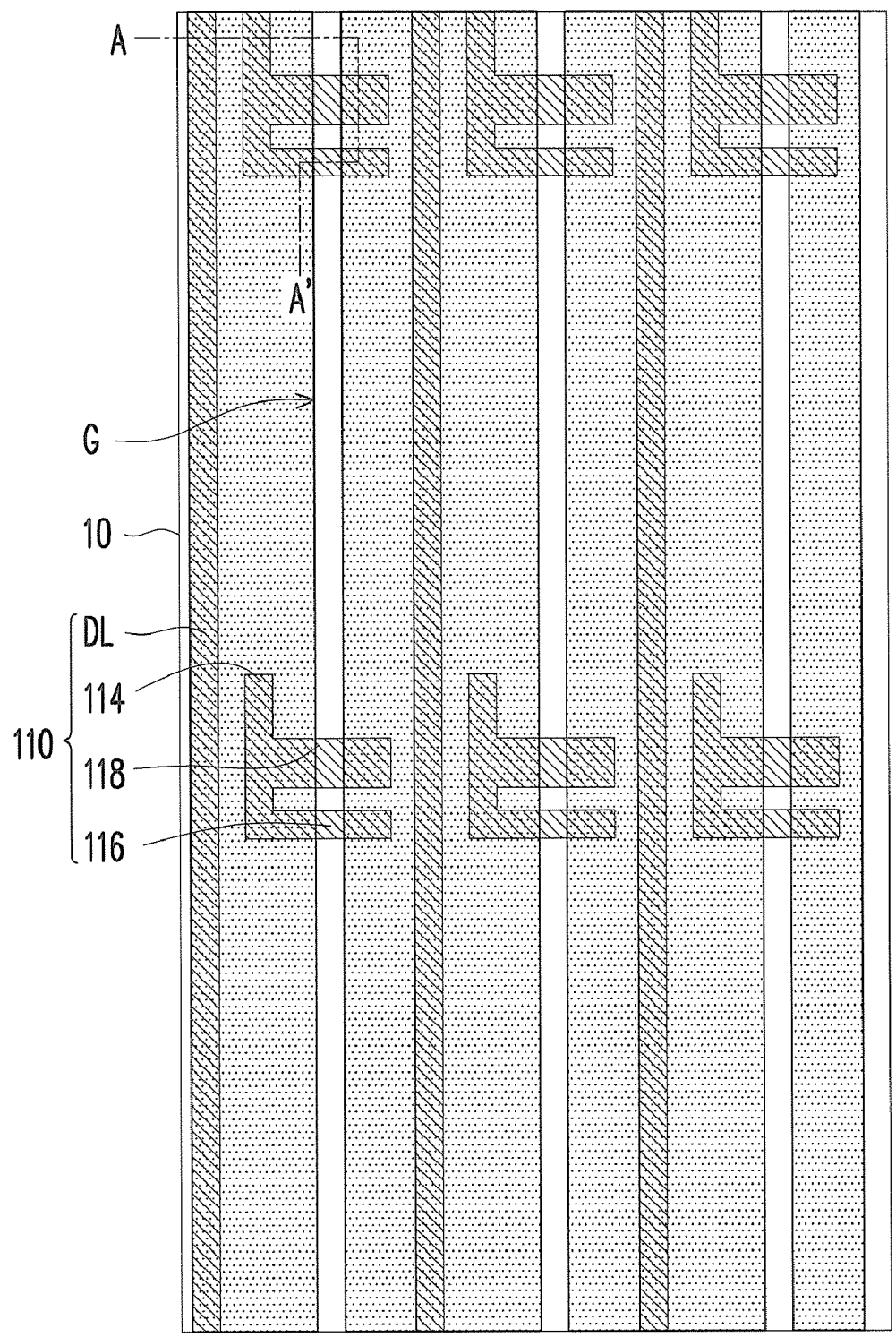
Figure 5C:
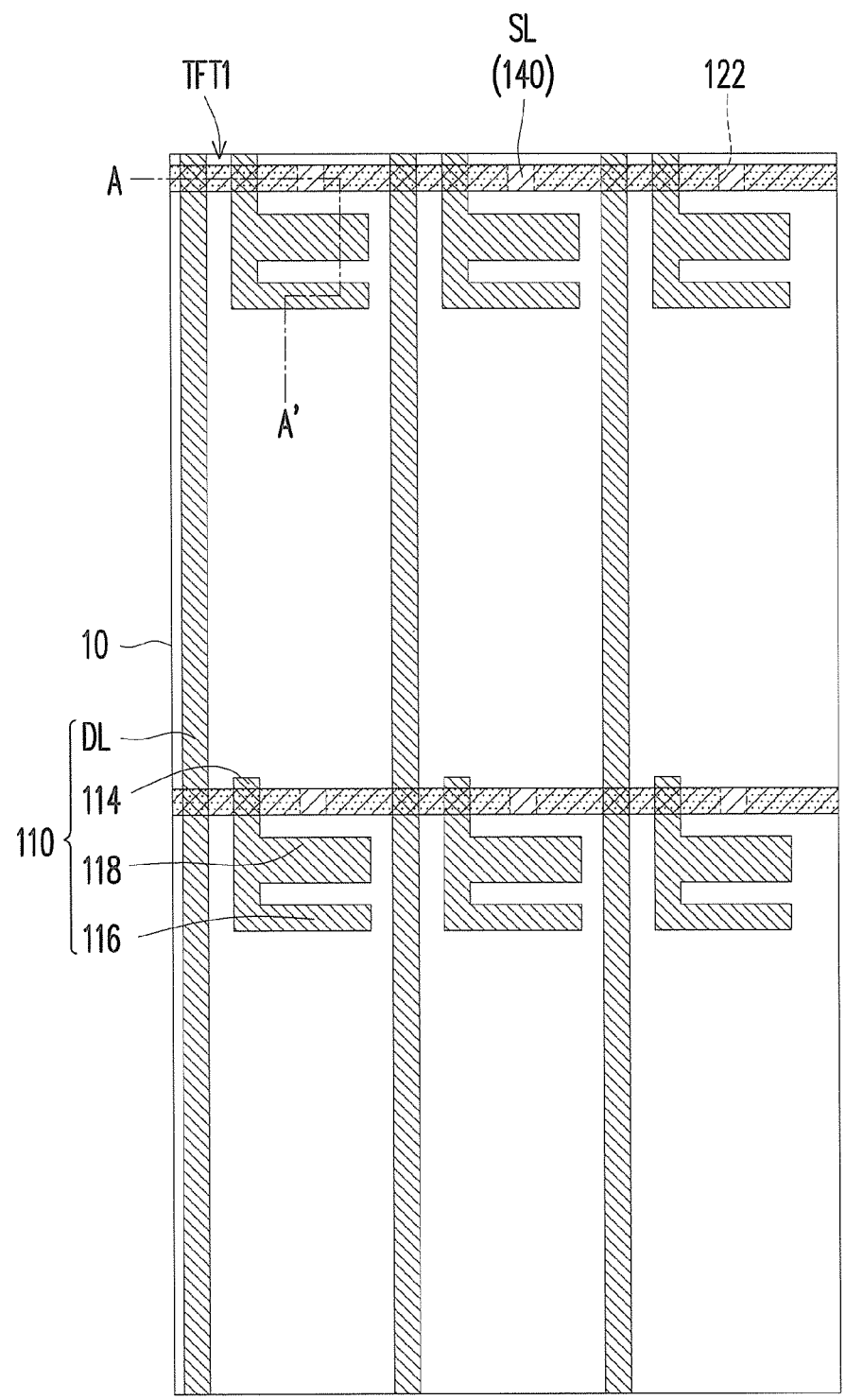
Figure 5D:
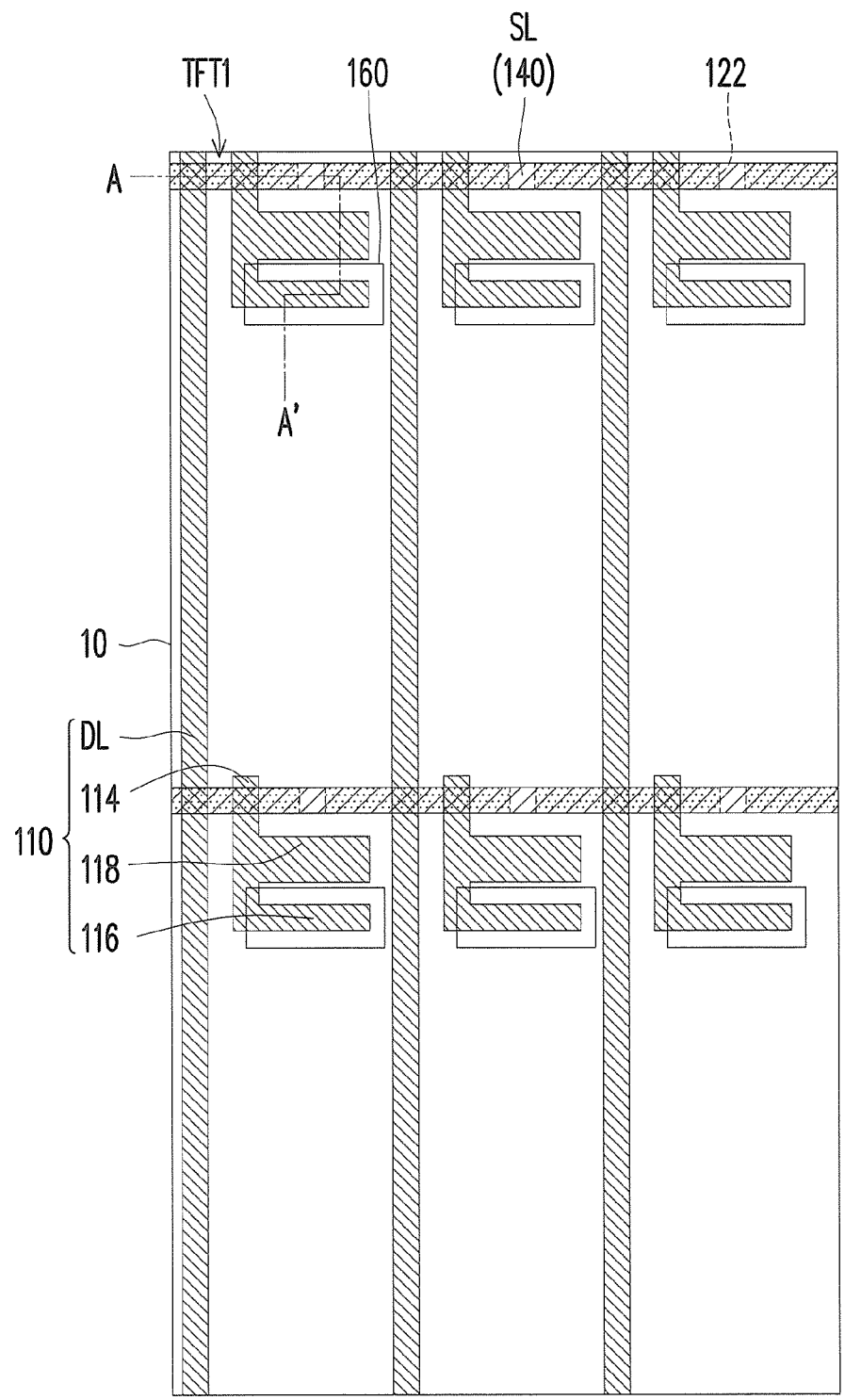
Figure 5E:
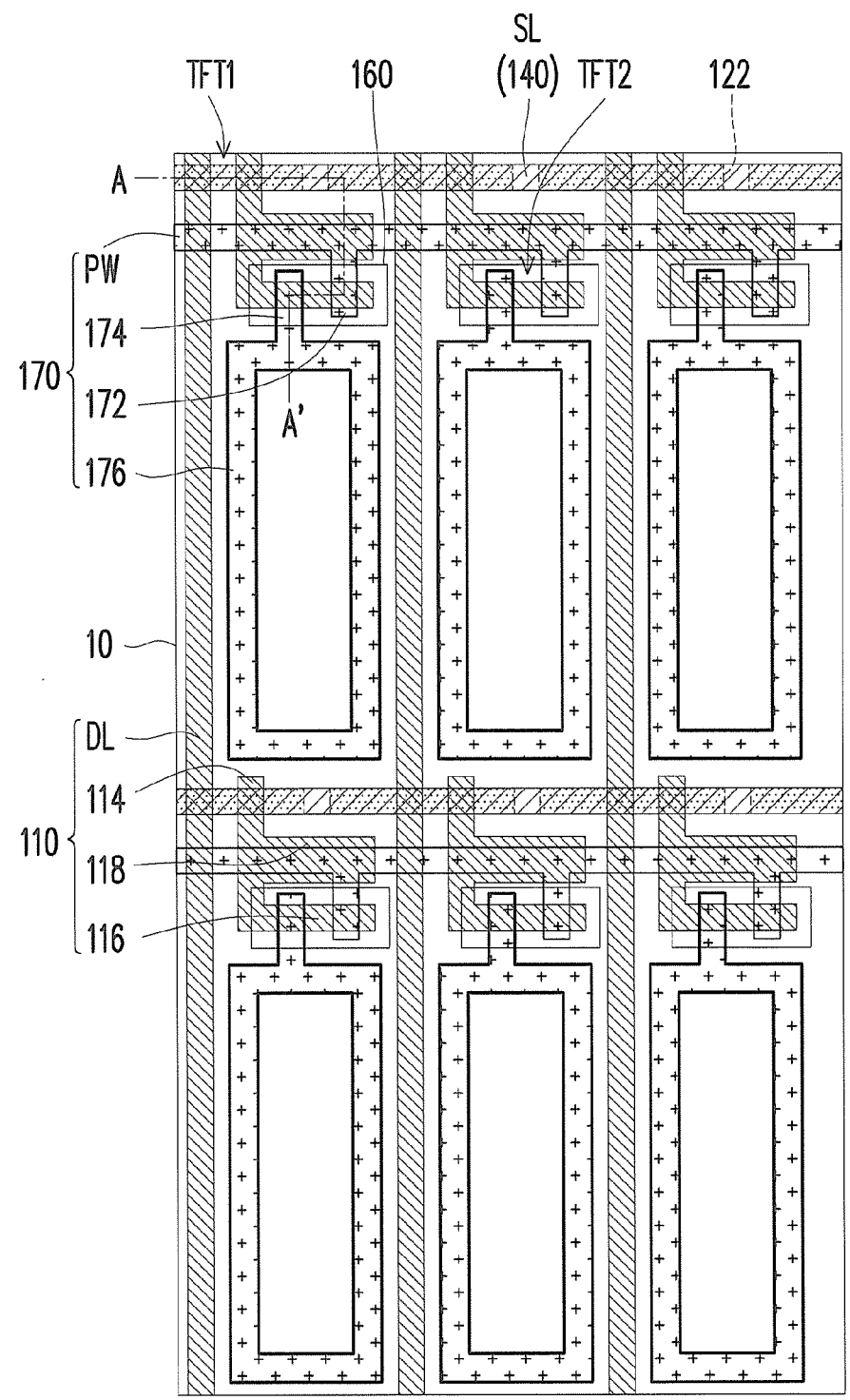
Figure 5F:
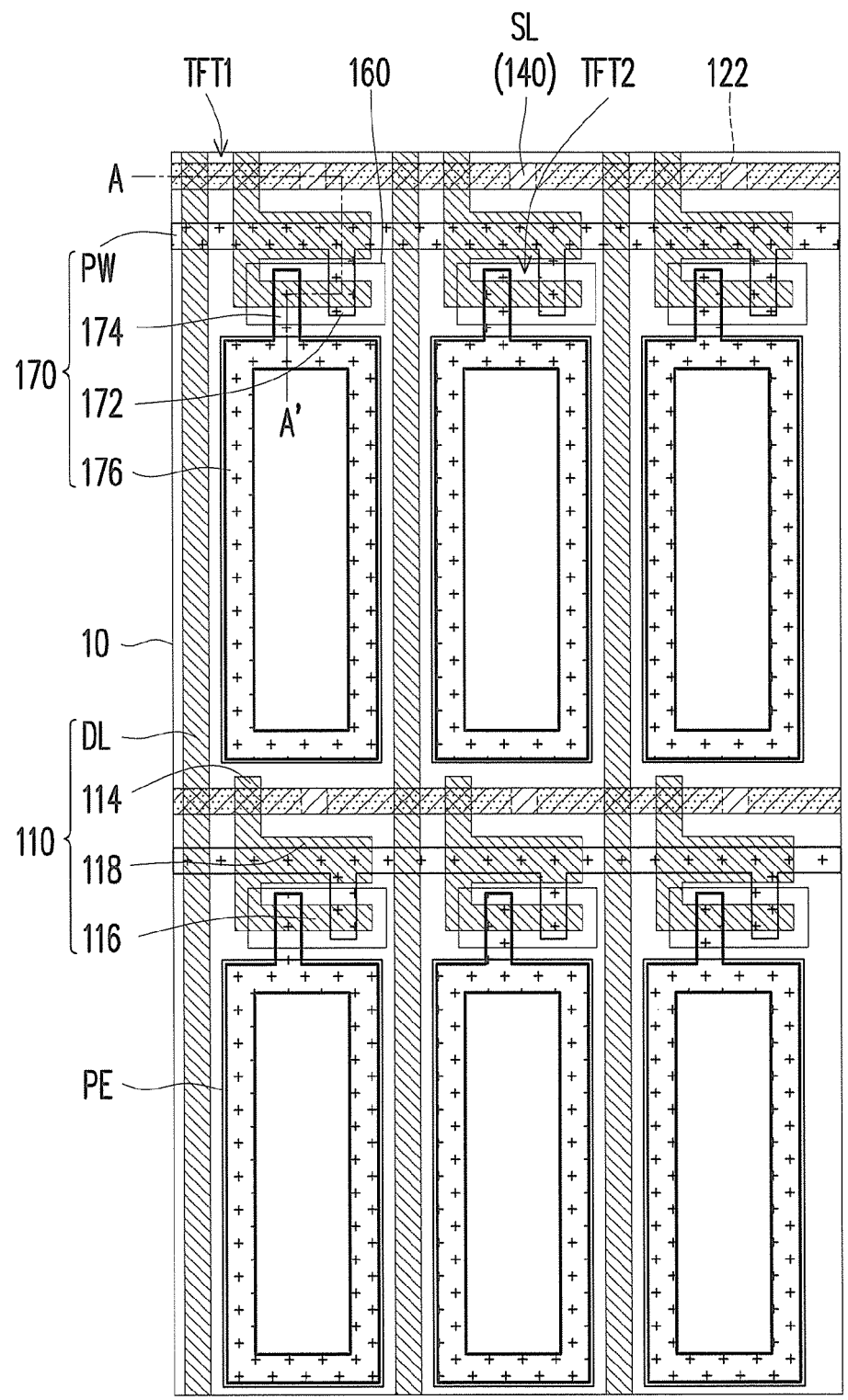
Figure 5G:
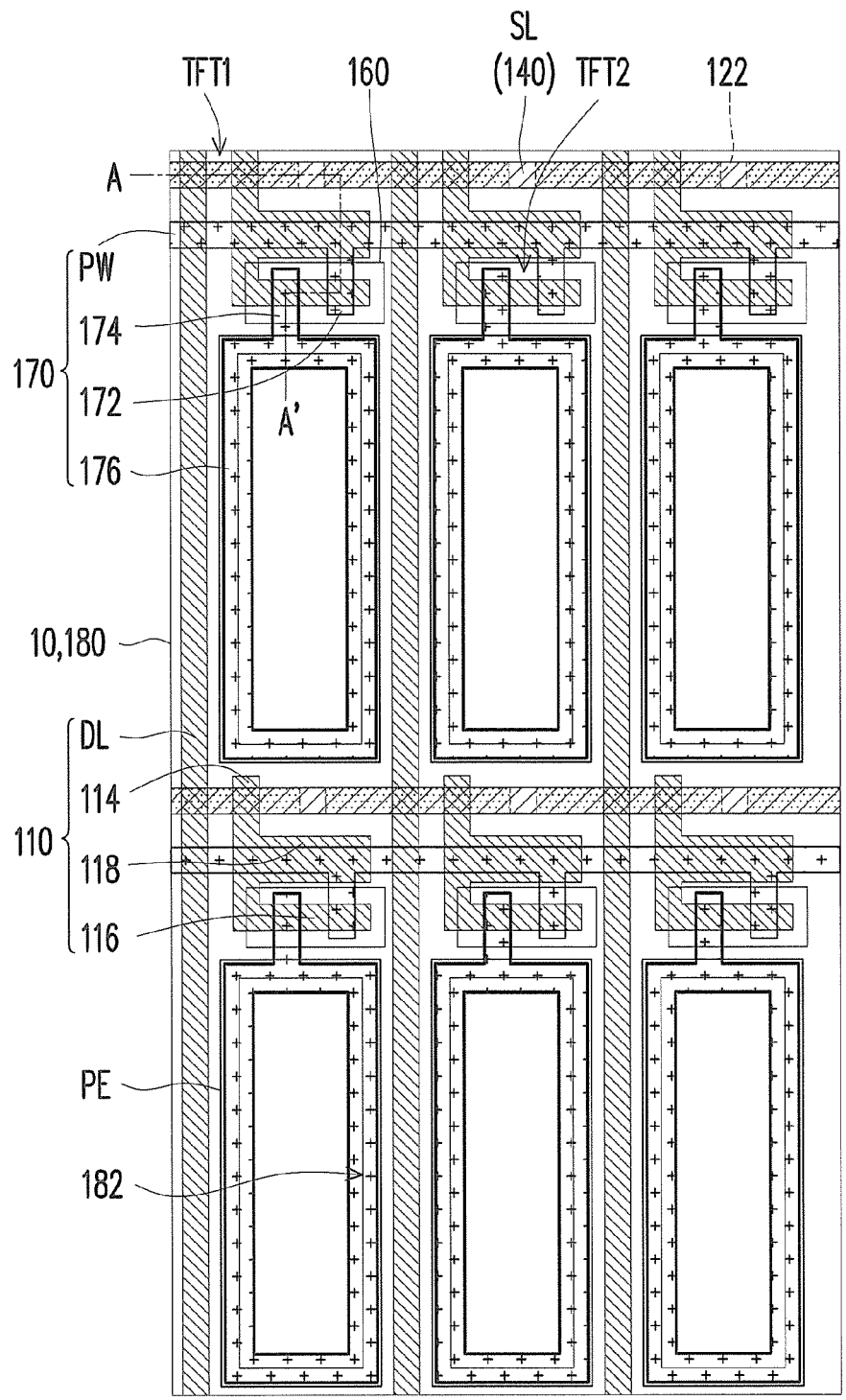
Figure 6C:
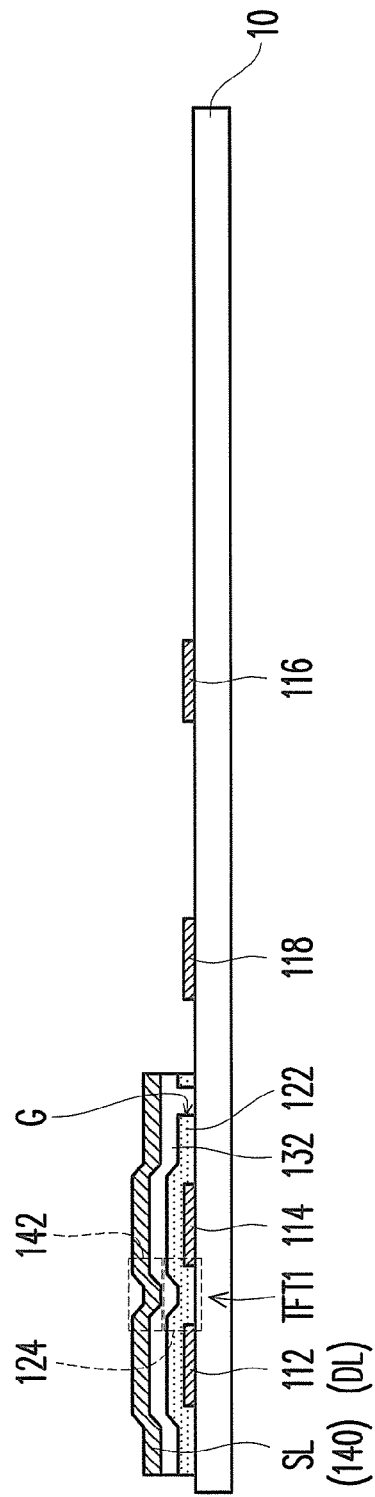

FIG. 5A through FIG. 5G are the top views schematically illustrating a method of fabricating an organic light emitting diode array according to en embodiment of the disclosure and FIG. 6A through FIG. 6G are schematic cross-sectional views along a line A-A' of FIGS. 5A to 5G. Referring to FIG. 5A and FIG. 6A, a method of fabricating an array of the organic light emitting diode pixel 400 according to the present embodiment includes forming a first patterned metal layer 110 on a substrate 10 first, wherein the first patterned metal layer 110 includes a plurality of data lines DL, a plurality of first drains 114, a plurality of second gates 116, and a plurality of capacitance bottom electrodes 118. In the present embodiment, each of the first drains 114 is connected to corresponding one second gate 116 and the data lines DL are separated from the first drains 114 and the second gates 116. A portion of the data line DL is served as the first source 112. The first patterned metal layer 110 exemplarily includes the capacitance bottom electrodes 118. In an alternative embodiment, the capacitance bottom electrode 118 on the substrate 10 can be omitted. That is to say, other embodiments can be designed without the capacitance bottom electrode 118.

Next, refereeing to FIG. 5B and FIG. 6B, the oxide semiconductor layer 120 and the first insulation layer 130 can be formed on the substrate 10, wherein the oxide semiconductor layer 120 can have a plurality of gaps G parallel to the extension direction of the data lines DL. In one embodiment, the oxide semiconductor layer 120 can selectively be configured without the gaps G. A smallest width of the gap G is determined based on the etching capability during fabricating the oxide semiconductor layer 120 and generally is 4 μm.

Then, referring to FIG. 5C and FIG. 6C, a second patterned metal layer 140 is formed on the first insulation layer 130 and the first insulation layer 130 and the oxide semiconductor layer 120 are patterned by using the second patterned metal layer 140 as a mask such that a first patterned insulation layer 132 and a first patterned oxide semiconductor layer 122 are fabricated.

In the present embodiment, the second patterned metal layer 140 includes a plurality of scan lines SL intersecting the data lines DL so that the first sources 112 are defined in the data lines DL. Herein, the first patterned oxide semiconductor layer 122 located between the first source 112 and the first drain 114 forms the channel layer 124. In addition, a portion of the scan line SL corresponding to the first channel layer 124 is defined as the first gate 142. The first gate 142, the first channel layer 124, the first source 112, and the first drain 114 together constitute a first transistor TFT1 as shown in FIG. 4.

After the above process, the first patterned insulation layer 132 and the patterned oxide semiconductor layer 122 substantially have the shape similar to the scan line SL. Therefore, the first gate 142 and the first channel layer 124 are fabricated in a self-aligned manner, wherein the mis-alignment situation between the first gate 142 and the first channel layer 124 is not liable to occur. In a word, the method according to the present embodiment has high fabricating yield rate. In addition, the oxide semiconductor layer 120 of this embodiment has a plurality of gaps G. The shape of the first patterned oxide semiconductor layer 122 though is substantially identical to the shape of the scan line SL; the plurality of channel layers 124 under the same scan line SL can be separated by the gaps G. Accordingly, the plurality of the first transistors TFT1 is electrically independent from each other.

Figure 6D:
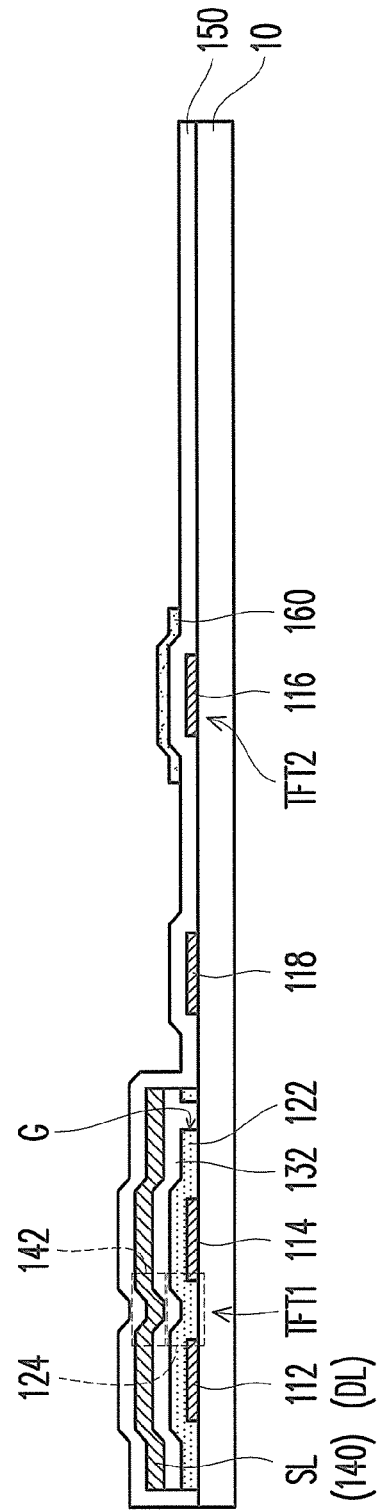

Referring to FIG. 5D and FIG. 6D, a second insulation layer 150 is formed on the first transistors TFT1, the second gates 116, and the capacitance bottom electrodes 118 and a plurality of second channel layers 160 are formed on the second gates 116.

Referring to FIG. 5E and FIG. 6E, a third patterned metal layer 170 is then formed over the substrate 10 and the third patterned metal layer 170 includes a plurality of power lines PW, a plurality of second sourced 172, and a plurality of second drains 174. The power lines PW are substantially parallel to the scan lines SL and located above the capacitance bottom electrodes 118. The second sources 172 are connected to the power lines PW. The second gate 116, the second channel layer 162, the second source 172, and the second drain 174 together constitute a second transistor TFT2. The power line PW and the capacitance bottom electrode 118 together form a storage capacitor Cs. In addition, a ring pattern 176 connected to the second drain 174 is simultaneously defined during the formation of the third patterned metal layer 170.

Subsequently, referring to FIG. 5F and FIG. 6F, a plurality of pixel electrodes PE are formed on the substrate 10 and each of the pixel electrodes PE is disposed on one of the ring patterns 176 so as to electrically connected to the second drain 174. However, the application is not restricted herein. In an alternative embodiment, the third patterned metal layer 170 can be configured without having the ring patterns 176 and the pixel electrodes PE can be directly connected to the second drains 174. In the present embodiment, the pixel electrodes PE are fabricated by transparent conductive material, but the application should not be limited to the embodiment.

Figure 6G:
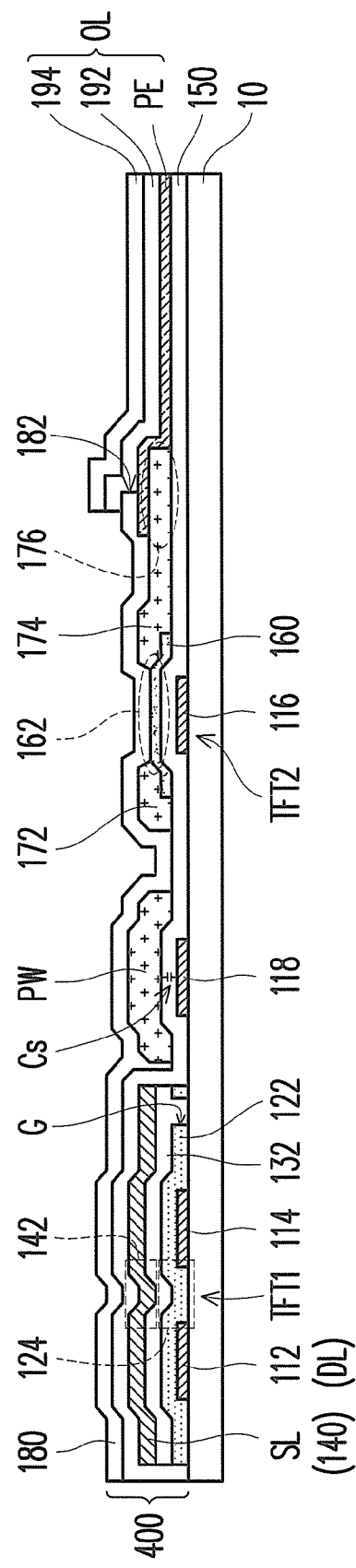

Specifically, for protecting the components, referring to FIG. 5G and FIG. 6G, a third insulation layer 180 is formed on the substrate 10 and the third insulation layer 180 has a plurality of openings 182 to expose the pixel electrodes PE. A material of the third insulation layer 180 may include $Si_3N_4$, $SiO_2$, $Al_2O_3$, $Ta_2O_5$, $HfO_2$, or $TiO_2$.

The pixel electrode PE exposed by the opening 182 can be served as an anode of the organic light emitting unit and a organic light emitting layer 192 and a cathode 194 can be subsequently formed on the pixel electrode PE. Herein, the pixel electrode PE, the organic light emitting layer 192, and the cathode 194 together form the organic light emitting unit OL depicted in FIG. 4. The organic light emitting diode pixel 400 consisting of the organic light emitting unit OL, the first transistor TFT1, and the second transistor TFT2 is fabricated and an organic light emitting diode array 4000 is formed by a plurality of the organic light emitting diode pixel 400 on the substrate 10. The pixel electrode PE has transparent characteristic so that the organic light emitting diode pixel 400 is an bottom emission type organic light emitting element.

The above embodiment showing that the first patterned metal layer 110 is formed prior to the formation of the oxide semiconductor layer 120 is merely taken as an example, but the application is not limited thereto. In an alternative embodiment, the oxide semiconductor layer 120 can be formed on the substrate 10 prior to the first patterned metal layer 110 is formed. It is noted that the pixel array is formed by a plurality of pixels arranged in array on the substrate 10. Therefore, for clearly illustrating the scope of the application and make the drawings clear, the following embodiments depict only one pixel rather than a plurality of pixels to describe those embodiments.

Figure 7:
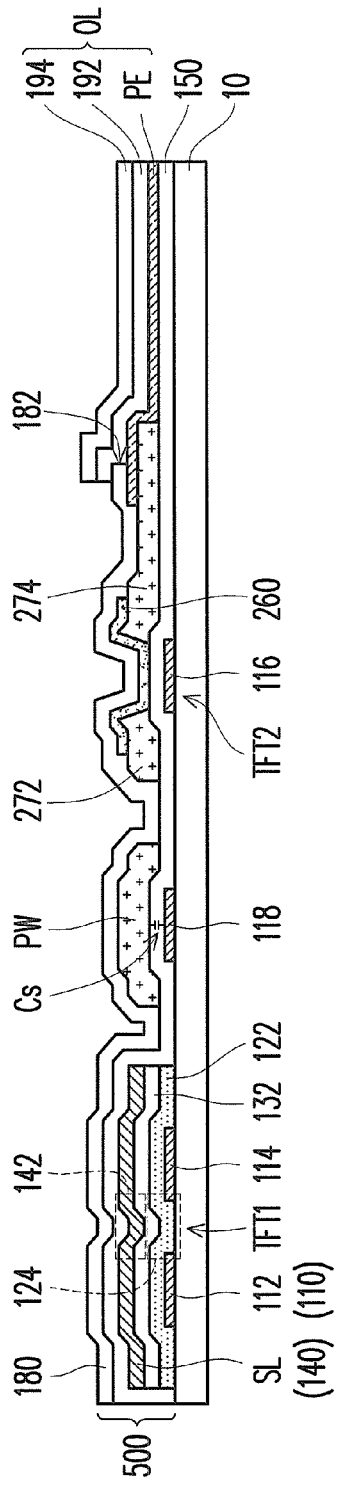
FIG. 7 is a schematic cross-sectional view of an organic light emitting diode pixel according to another embodiment of the disclosure.

FIG. 7 is a schematic cross-sectional view of an organic light emitting diode pixel according to further another embodiment of the disclosure. Referring to FIG. 7, the organic light emitting diode pixel 500 is substantially similar to the organic light emitting diode pixel 400. In detail, the second source 272, the second drain 274, and the power line PW are formed prior to the second patterned oxide semiconductor layer 260 is formed when fabricating the organic light emitting diode pixel 500. Accordingly, the second patterned oxide semiconductor layer 260 partially covers the second source 272 and the second drain 274. That is to say, the active device array 200 depicted in FIG. 2 is applied in the organic light emitting diode pixel 500.

Figure 8:
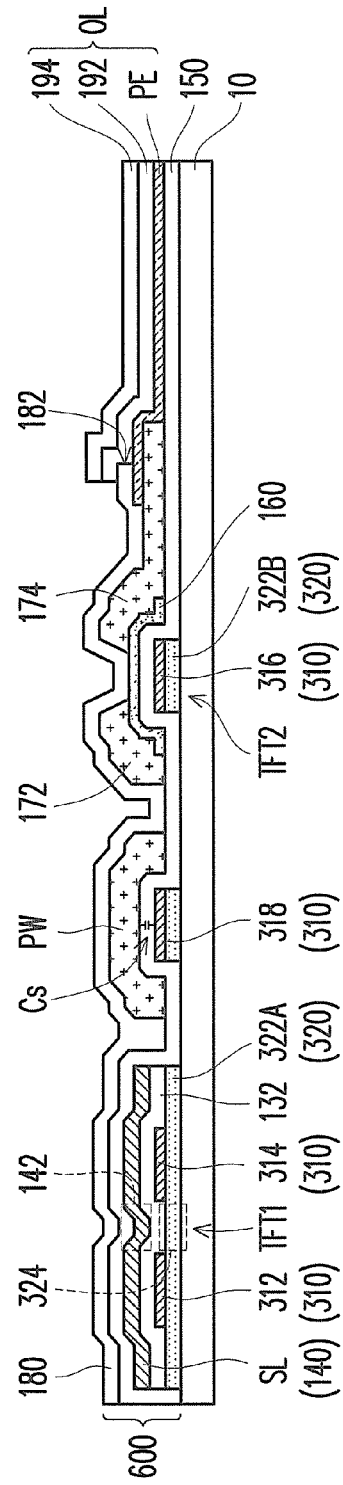
FIG. 8 is a schematic cross-sectional view of an organic light emitting diode pixel according to further another embodiment of the disclosure.

FIG. 8 is a schematic cross-sectional view of an organic light emitting diode pixel according to further another embodiment of the disclosure. Referring to FIG. 8, the organic light emitting diode pixel 600 is substantially similar to the organic light emitting diode pixel 400. In detail, the oxide semiconductor layer is formed prior to the first patterned metal layer 310 is formed when fabricating the organic light emitting diode pixel 600. That is to say, the active device array 300 depicted in FIG. 3 is applied in the organic light emitting diode pixel 600.

The organic light emitting diode pixel 600 includes the first transistor TFT1, the second transistor TFT2, and the organic light emitting unit OL, wherein the first patterned oxide semiconductor layer 322 is located under the first patterned metal layer 310 consisting of the first source 312, the first drain 314, the second gate 316, and the capacitance bottom electrode 318. In the embodiment, a portion of the first patterned oxide semiconductor layer 322 is covered by the first patterned metal layer 310 and the other portion of the first patterned oxide semiconductor layer 322 is patterned by using the scan line SL as a mask. Accordingly, the first gate 142 and the first channel layer in the first transistor TFT1 are self-aligned during the patterning process and the mis-alignment problem is not easily occurred. The pixel array consisting of the organic light emitting diode pixel 600 can have desirable fabrication yield rate.

Figure 9:
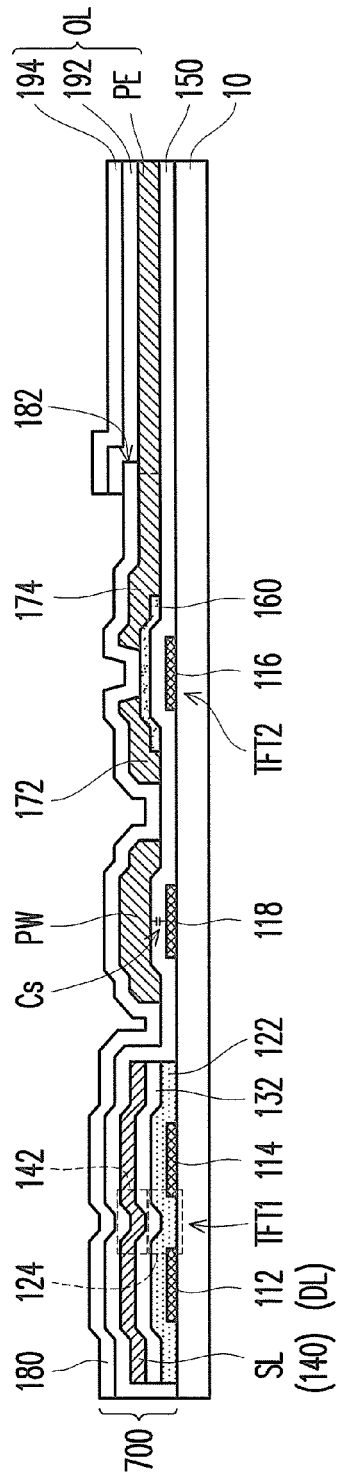
FIG. 9 is a schematic cross-sectional view of an organic light emitting diode pixel according to still another embodiment of the disclosure.

In the foregoing embodiments, the pixel electrodes and the third patterned metal layer are independently fabricated. In other embodiments, the pixel electrode can be formed by the third patterned metal layer. FIG. 9 is a schematic cross-sectional view of an organic light emitting diode pixel according to still another embodiment of the disclosure. Referring to FIG. 9, the organic light emitting diode pixel 700 is substantially similar to the organic light emitting diode pixel 400 and the difference therebetween lies in that the pixel electrode PE of the organic light emitting diode pixel 700 is integrally formed with the second drain 174. The pattern of the third patterned metal layer 170 is modified to form the pixel electrode PE during the fabrication of the second drain 174. Other components in the organic light emitting diode pixel 700 can be referred to those depicted in the organic light emitting diode pixel 400. In the present embodiment, the second drain 174 is made by opaque metal material so that the pixel electrode PE is also opaque and the organic light emitting diode pixel 700 is substantially a top emission type light emitting element. Herein, the substrate 10 can be an opaque substrate such as the metal substrate, the stainless steel substrate, or the like.

Figure 10:
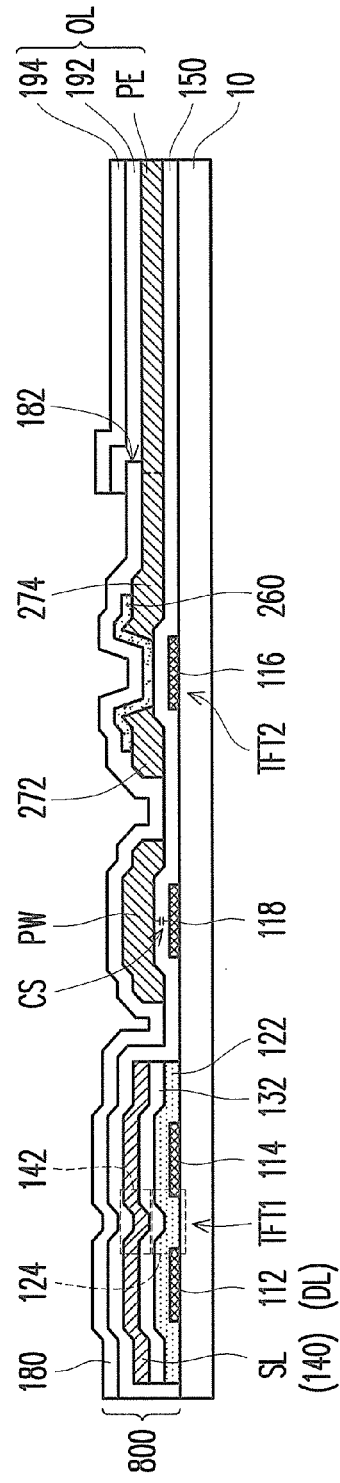
FIG. 10 is a schematic cross-sectional view of an organic light emitting diode pixel according to further another embodiment of the disclosure.

FIG. 10 is a schematic cross-sectional view of an organic light emitting diode pixel according to further another embodiment of the disclosure. Referring to FIG. 10, the organic light emitting diode pixel 800 is substantially similar to the organic light emitting diode pixel 500 and the difference therebetween lies in that the pixel electrode PE of the organic light emitting diode pixel 800 is integrally formed with the second drain 274. The pattern of the third patterned metal layer 270 is modified to form the pixel electrode PE during the fabrication of the second drain 274. Other components in the organic light emitting diode pixel 800 can be referred to those depicted in the organic light emitting diode pixel 500. In the present embodiment, the component marked 194 can be a semi transparent metal layer and served as the cathode 194 of the organic light emitting unit OL so that the organic light emitting diode pixel 800 is a top emission type organic light emitting element.

Figure 11:
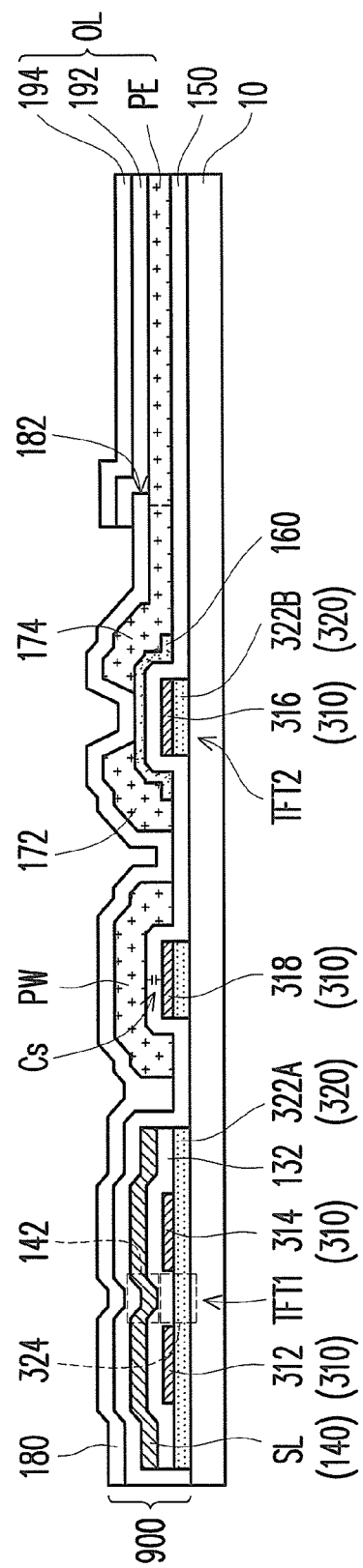
FIG. 11 is a schematic cross-sectional view of an organic light emitting diode pixel according to still another embodiment of the disclosure.

FIG. 11 is a schematic cross-sectional view of an organic light emitting diode pixel according to still another embodiment of the disclosure. Referring to FIG. 11, the organic light emitting diode pixel 900 is substantially similar to the organic light emitting diode pixel 600 and the difference therebetween lies in that the pixel electrode PE of the organic light emitting diode pixel 900 is integrally formed with the second drain 174. The pattern of the third patterned metal layer 170 is modified to form the pixel electrode PE during the fabrication of the second drain 174. Other components in the organic light emitting diode pixel 900 can be referred to those depicted in the organic light emitting diode pixel 600. In the present embodiment, the organic light emitting diode pixel 900 is substantially a top emission type organic light emitting element.

Figure 12:
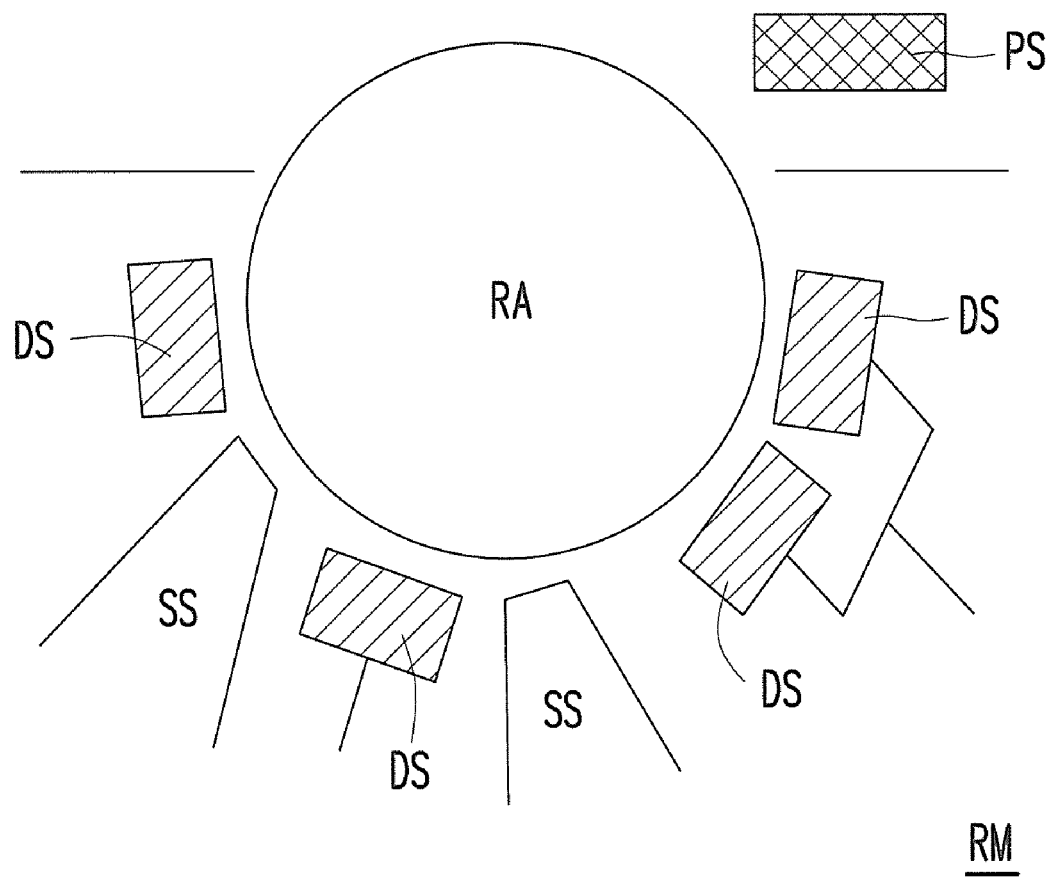
FIG. 12 is a schematic view schematically illustrating a roll-to-roll sputter machine.

It is noted that the film layers depicted in the above embodiments can be fabricated by using a roll-to-roll sputtering process and part of the film layers can be fabricated sequentially by using the roll-to-roll sputtering process. FIG. 12 schematically illustrates a roll-to-roll machine adopted in the fabrication method of the application. Referring to FIG. 12, a roll-to-roll machine RM includes a drum RA, a plurality of deposition sections DS, a plurality of separation sections SS, and a pre-treatment section PS. The pre-treatment section PS is set beside the roll-to-roll machine RM and the deposition section DS and the separation section SS alternately arranged surround the drum RA. A flexible substrate (not shown) is rolled along the drum RA and various layers are formed on the flexible substrate in different deposition sections DS during performing the roll-to-roll sputtering process. In an embodiment, a power of the sputtering emitter configured in the deposition sections DS can be a radio frequency (RF) emitter, a magnetron sputtering (MS) emitter, a direct current (DC) emitter, an pulse DC emitter, or the like. A pressure in the deposition section DC is between 1 Pa to $10^{-4}$ Pa, the gas inserted into the deposition section DS can be Ar, $O_2$, $N_2$, and the like, and the flux of the gas is from 0 sccm to 200 sccm during the sputtering process. A rotating speed of the drum RA during the sputtering process is from 0.1 m/min to 10 m/min. The temperature of the drum RA can be set at −15° C. to 80° C. during the sputtering process, and room temperature is common.

In view of the above, the scan line and the gate formed by the second patterned metal layer are served as a mask to pattern the oxide semiconductor layer. The gate and the channel layer are fabricated in a self-aligned manner, which reduces the probability of mis-alignment. The methods of fabricating the active device array and the organic light emitting diode pixel array have favorable yield rate. In addition, the oxide semiconductor material having the characteristic such as an ohmic contact is used to make the channel layer. No additional ion implanting process or the like is required in the method provided by the application. When the material of the substrate is the materials with low heat resistance, the substrate is prevented from deformed due to the high fabrication temperature of the ion implanting process or other high temperature process.

Although the application has been described with reference to the above embodiments, it will be apparent to one of the ordinary skill in the art that modifications to the described embodiment may be made without departing from the spirit of the application. Accordingly, the scope of the application will be defined by the attached claims not by the above detailed descriptions.

What is claimed is:

1. A method of fabricating an active device array, the active device array comprising at least one first transistor and at least one second transistor, and the method of fabricating the active device array comprising:
    forming a first patterned metal layer over a substrate, the first patterned metal layer comprising a first source of the first transistor, a first drain of the first transistor, and a second gate of the second transistor, wherein the first drain and the first source are separated from each other;
    forming an oxide semiconductor layer over the substrate entirely;
    forming a first insulation layer on the substrate entirely to cover the oxide semiconductor layer and the first patterned metal layer;
    forming a second patterned metal layer on the first insulation layer, wherein the second patterned metal layer defines a first gate of the first transistor located between the first source and the first drain;
    patterning the oxide semiconductor layer and the first insulation layer by using the second patterned metal layer as a mask to form a first patterned oxide semiconductor layer and a first patterned insulation layer, wherein the first patterned oxide semiconductor layer comprises a first channel layer of the first transistor;
    forming a second insulation layer on the substrate entirely to cover the first transistor and the second gate;
    forming a second patterned oxide semiconductor layer over the second insulation layer, the second patterned oxide semiconductor layer comprising a second channel layer located above the second gate; and
    forming a third patterned metal layer over the second insulation layer, the third patterned metal layer comprising a second source of the second transistor and a second drain of the second transistor, wherein the second source and the second drain are respectively located at two opposite sides of the second gate.

2. The method of fabricating the active device array as claimed in claim 1, wherein a process of forming at least one of the first patterned metal layer, the first patterned oxide semiconductor layer, the first insulation layer, the second patterned oxide semiconductor layer, the second patterned metal layer, the second insulation layer, and the third patterned metal layer comprises a roll-to-roll sputtering process.

3. The method of fabricating the active device array as claimed in claim 1, wherein a process of forming the oxide semiconductor layer further comprises when a number of the first transistor is plural, forming a plurality of gaps in the oxide semiconductor layer and providing the gaps separating the first channels.

4. The method of fabricating the active device array as claimed in claim 1, wherein the first patterned metal layer is formed on the substrate prior to the oxide semiconductor layer is formed.

5. The method of fabricating the active device array as claimed in claim 1, wherein the oxide semiconductor layer is formed on the substrate prior to the first patterned metal layer is formed.

6. The method of fabricating the active device array as claimed in claim 1, wherein the second patterned oxide semiconductor layer is formed prior to the third patterned metal layer is formed.

7. The method of fabricating the active device array as claimed in claim 1, wherein the third patterned metal layer is formed prior to the second patterned oxide semiconductor layer is formed.

8. The method of fabricating the active device array as claimed in claim 1, wherein materials of the first patterned oxide semiconductor layer and the second patterned oxide semiconductor layer respectively comprises zinc oxide, indium tin oxide, or indium zinc tin oxide.

9. The method of fabricating the active device array as claimed in claim 1, wherein the first patterned oxide semiconductor layer and the second patterned oxide semiconductor layer respectively comprise a dopant and the dopant is selected from indium, aluminum, gallium, tin, or a combination of the above.

10. The method of fabricating the active device array as claimed in claim 1, wherein a material of the substrate comprises plastic or metal.

11. A method of fabricating an organic light emitting diode array, the organic light emitting diode array comprising a plurality of scan line, a plurality of data lines, a plurality of power lines, and a plurality of pixels, each of the pixels comprising a first transistor, a second transistor, and a pixel electrode, wherein the first transistor is connected to one of the scan lines and one of the data lines and the second transistor is connected to the first transistor, one of the power lines, and the pixel electrode, and the method of fabricating the organic light emitting diode array comprising:
    forming a first patterned metal layer over a substrate, the first patterned metal layer comprising the data lines, first sources of the first transistors, first drains of the first transistors, and second gates of the second transistors, wherein the first drains are connected to the second gates and separated from the data lines;
    forming an oxide semiconductor layer over the substrate entirely;
    forming a first insulation layer on the substrate entirely to cover the oxide semiconductor layer and the first patterned metal layer;
    forming a second patterned metal layer on the first insulation layer, wherein the second patterned metal layer comprises the scan lines intersecting the data lines and the first drains so as to define a plurality of first gates of the first transistor;
    patterning the oxide semiconductor layer and the first insulation layer by using the second patterned metal layer as a mask to form a first patterned oxide semiconductor layer and a first patterned insulation layer, wherein the first patterned oxide semiconductor layer comprises a plurality of first channel layers of the first transistors;
    forming a second insulation layer on the substrate entirely to cover the first transistors, the scan lines, the data lines, and the second gate;
    forming a second patterned oxide semiconductor layer over the second insulation layer, the second patterned oxide semiconductor layer comprising a plurality of second channel layers located above the second gates respectively;

forming a third patterned metal layer over the second insulation layer, the third patterned metal layer comprising the power lines, a plurality of second sources of the second transistors, and a plurality of second drains of the second transistors, wherein the second sources are connected to the power lines and the second sources and the second drains are respectively located at two opposite sides of the second gates;

forming the pixel electrodes on the substrate, wherein each of the pixel electrodes is electrically connected to one of the second drains; and forming a third insulation layer on the substrate to cover the first active devices and the second active devices.

12. The method of fabricating the organic light emitting diode array as claimed in claim 11, wherein a process of forming at least one of the first patterned metal layer, the first patterned oxide semiconductor layer, the first insulation layer, the second patterned oxide semiconductor layer, the second patterned metal layer, the second insulation layer, the third patterned metal layer, and the third insulation layer comprises a roll-to-roll sputter process.

13. the method of fabricating the organic light emitting diode array as claimed in claim 11, wherein the process of forming the oxide semiconductor layer further comprises forming a plurality of gaps in the oxide semiconductor layer, the gaps are substantially parallel to the data lines, each of the gaps is located between two adjacent data lines, and the gaps separate the first channel layers under each of the scan lines.

14. The method of fabricating the organic light emitting diode array as claimed in claim 11, wherein the first patterned metal layer is formed on the substrate prior to the oxide semiconductor layer is formed.

15. The method of fabricating the organic light emitting diode array as claimed in claim 11, wherein the oxide semiconductor layer is formed on the substrate prior to the first patterned metal layer is formed.

16. The method of fabricating the organic light emitting diode array as claimed in claim 11, wherein a process of forming the third insulation layer comprises forming a plurality of openings in the third insulation layer to expose the pixel electrodes.

17. The method of fabricating the organic light emitting diode array as claimed in claim 16, further comprising forming a light emitting layer and a cathode on one pixel electrode exposed by the openings to form an organic light emitting unit.

18. The method of fabricating the organic light emitting diode array as claimed in claim 11, wherein the second patterned oxide semiconductor layer is formed prior to the third patterned metal layer is formed.

19. The method of fabricating the organic light emitting diode array as claimed in claim 11, wherein the third patterned metal layer is formed prior to the second patterned oxide semiconductor layer is formed.

20. The method of fabricating the organic light emitting diode array as claimed in claim 11, wherein the third patterned metal layer further comprises the pixel electrodes.

21. The method of fabricating the organic light emitting diode array as claimed in claim 11, wherein a process of forming the first patterned metal layer further comprises forming a plurality of capacitance bottom electrodes located under the power lines.

22. The method of fabricating the organic light emitting diode array as claimed in claim 11, wherein materials of the first patterned oxide semiconductor layer and the second patterned oxide semiconductor layer respectively comprises zinc oxide, indium tin oxide, or indium zinc tin oxide.

23. The method of fabricating the organic light emitting diode array as claimed in claim 11, wherein the first patterned oxide semiconductor layer and the second patterned oxide semiconductor layer respectively comprise a dopant and the dopant is selected from indium, aluminum, gallium, tin, or a combination of the above.

24. The method of fabricating the organic light emitting diode array as claimed in claim 11, wherein a material of the substrate comprises plastic or metal.

* * * * *